(12) United States Patent
Matsuda

(10) Patent No.: US 10,546,746 B2
(45) Date of Patent: Jan. 28, 2020

(54) PROCESS OF FORMING SEMICONDUCTOR EPITAXIAL SUBSTRATE

(71) Applicant: SUMITOMO ELECTRIC DEVICE INNOVATIONS, INC., Yokohama-shi, Kanagawa (JP)

(72) Inventor: Hajime Matsuda, Yokohama (JP)

(73) Assignee: SUMITOMO ELECTRIC DEVICE INNOVATIONS, INC., Kanagawa (JP)

( * ) Notice: Subject to any disclaimer, the term of this patent is extended or adjusted under 35 U.S.C. 154(b) by 0 days.

(21) Appl. No.: 16/019,104

(22) Filed: Jun. 26, 2018

(65) Prior Publication Data
US 2019/0006176 A1    Jan. 3, 2019

(30) Foreign Application Priority Data
Jun. 29, 2017  (JP) .................. 2017-127293

(51) Int. Cl.
*H01L 21/02* (2006.01)
*H01L 29/66* (2006.01)
*H01L 29/20* (2006.01)

(52) U.S. Cl.
CPC .... *H01L 21/02458* (2013.01); *H01L 21/0254* (2013.01); *H01L 21/0262* (2013.01); *H01L 21/02378* (2013.01); *H01L 29/66462* (2013.01); *H01L 29/2003* (2013.01)

(58) Field of Classification Search
CPC ......... H01L 21/02458; H01L 21/02378; H01L 21/0254; H01L 29/66462; H01L 21/0262; H01L 29/2003; H01L 29/7786; H01L 21/02505
See application file for complete search history.

(56) References Cited

U.S. PATENT DOCUMENTS

| | | | | |
|---|---|---|---|---|
| 6,440,214 B1* | 8/2002 | Hooper | ................... | C30B 23/02 117/101 |
| 2006/0128122 A1* | 6/2006 | Bousquet | ................ | C30B 23/02 438/478 |
| 2012/0021549 A1* | 1/2012 | Fujikane | ................. | C30B 25/20 438/46 |
| 2014/0151748 A1* | 6/2014 | Nishimori | ......... | H01L 29/42316 257/194 |
| 2015/0279658 A1* | 10/2015 | Yui | ..................... | H01L 21/0262 257/76 |
| 2016/0190278 A1 | 6/2016 | Yamada et al. | | |

FOREIGN PATENT DOCUMENTS

| | | |
|---|---|---|
| JP | 2003-151996 | 5/2003 |
| JP | 2012-54471 | 3/2012 |
| JP | 2016-127110 | 7/2016 |

* cited by examiner

*Primary Examiner* — Su C Kim
(74) *Attorney, Agent, or Firm* — Smith, Gambrell & Russell, LLP.

(57) ABSTRACT

A process of growing a barrier layer made of AlGaN on a GaN channel layer is disclosed. The process includes steps of, growing the GaN channel layer, growing the AlGaN barrier layer, and growing a cap layer made of GaN. The growth temperature of the AlGaN barrier layer monotonically lowers from the initial temperature, which may be equal to the growth temperature for the GaN channel layer, to the finish temperature that is lower than the initial temperature and may be substantially equal to the growth temperature of the GaN cap layer.

18 Claims, 8 Drawing Sheets

PROCESS OF FORMING SEMICONDUCTOR EPITAXIAL SUBSTRATE

CROSS REFERENCE TO RELATED APPLICATION

The present application is based on and claims the benefit of priority of Japanese Patent Application No. 2017-127293, filed on Jun. 29, 2017, the entire content of which is incorporated herein by reference.

BACKGROUND

1. Field of Invention

The present invention relates to a process of forming a semiconductor device, in particular, the invention relates to a process of forming an epitaxial substrate primarily made of nitride semiconductor materials.

2. Related Background Arts

Japanese Patent Applications laid open Nos. JP2003-151996A, JP2012-054471A, and JP2016-127110A, have disclosed a high electron mobility transistor (HEMT) made of nitride semiconductor materials. A HEMT primarily made of nitride semiconductor materials has excellent features of high breakdown voltage and high operational speed. A conventional HEMT provides a channel layer made of gallium nitride (GaN) and a barrier layer made of aluminum gallium nitride (AlGaN). A HEMT showing high output power requires to increase a maximum drain current $I_D$. A HEMT with an AlGaN barrier layer may enhance the maximum drain current by increasing aluminum compositions in the barrier layer. A greater aluminum composition causes a greater lattice mismatching between the AlGaN barrier layer and the GaN channel layer, which increases charges due the Piezo effect. However, an increased lattice mismatching between the AlGaN barrier layer and the GaN channel layer also causes stress due to the lattice mismatching in a deeper channel layer, which increases a leak current between ohmic electrodes, namely, between the drain electrode and the source electrode.

SUMMARY

An aspect of the present invention relates to a process of forming an epitaxial substrate. The process comprises steps of: (1) growing a channel layer made of gallium nitride (GaN) on a substrate under a first temperature; (2) growing a barrier layer made of aluminum gallium nitride (AlGaN) on the channel layer; and (3) growing a cap layer made of GaN on the barrier layer. A feature of the process of the present invention is that the step of growing the barrier layer monotonically decreases a growth temperature thereof from an initial temperature at a beginning to a finish temperature at a completion, where the finish temperature is lower than the initial temperature.

BRIEF DESCRIPTION OF THE DRAWINGS

The foregoing and other purposes, aspects and advantages will be better understood from the following detailed description of a preferred embodiment of the invention with reference to the drawings, in which.

DESCRIPTION OF EMBODIMENTS

Next, some embodiments according to the present invention will be described as referring to accompanying drawings. However, the present invention is not restricted to those embodiments but includes all aspects defined in claims and all modifications and equivalent thereto. In the description of the drawings, numerals or symbols same with or similar to each other will refer to elements same with or similar to each other without overlapping explanations.

Figure 1:
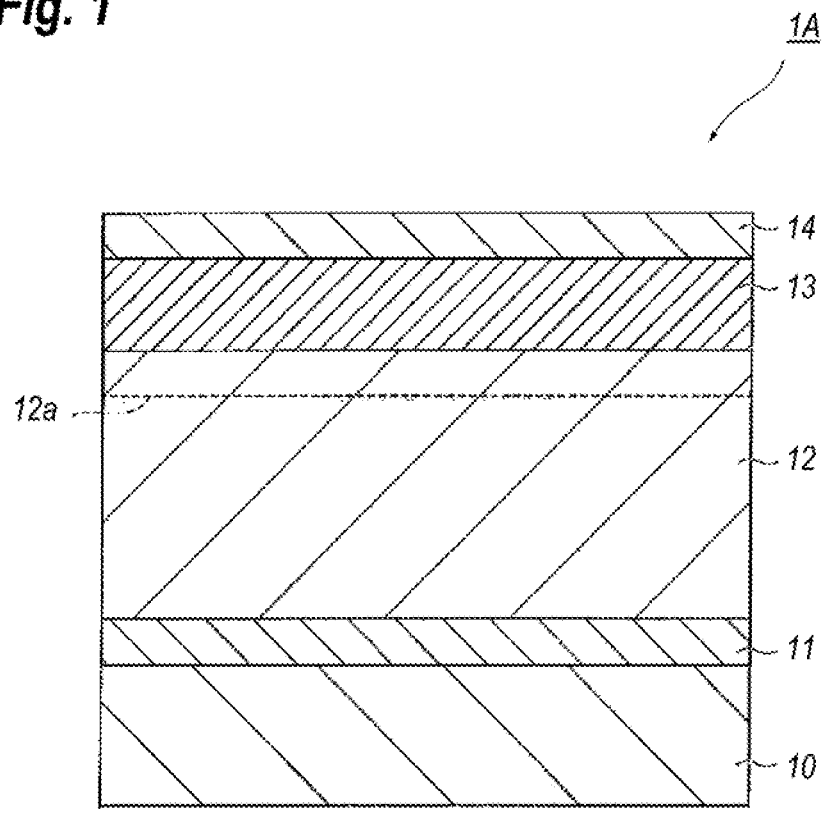
FIG. 1 shows a cross section of an epitaxial substrate formed by a process according to an embodiment of the present invention.
Figure 2:
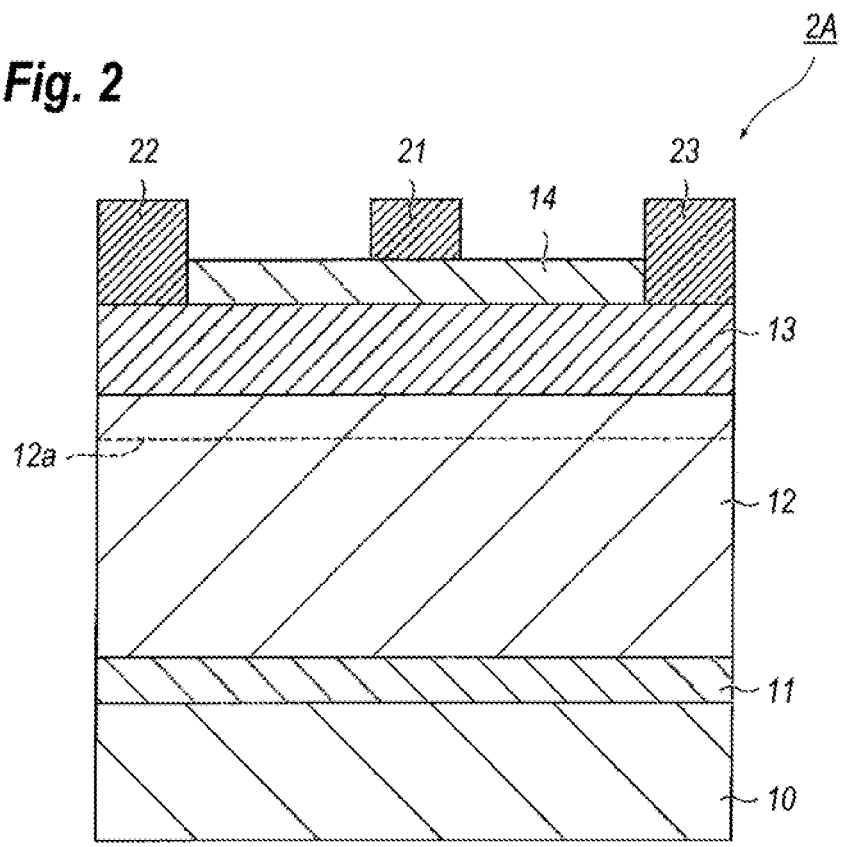
FIG. 2 shows a cross section of a high electron mobility transistor (HEMT) formed by a process according to an embodiment of the present invention.

FIG. 1 shows a cross section of an epitaxial substrate 1A according to an embodiment of the present invention, and FIG. 2 shows a cross section of a high electron mobility transistor (HEMT) 2A of an embodiment of the present invention. The epitaxial substrate 1A includes a substrate made of silicon carbide (SiC) 10, a nucleus forming layer 11 made of aluminum nitride (AlN), a channel layer 12 made of gallium nitride (GaN), a barrier layer 13 made of aluminum gallium nitride (AlGaN), and a cap layer 14 made of GaN. Layers from the nucleus forming layer 11 to the cap layer 14 are epitaxially grown on the substrate 10 in this order. The HEMT 2A shown in FIG. 2 provides electrodes of a gate 21, a source 22, and a drain 23 on the epitaxial substrate 1A.

The SiC substrate 10 is a semi-insulating substrate. The nucleus forming layer 11 is epitaxially grown on the substrate 10 and has a function of a seed layer for the channel layer 12. The nucleus forming layer 11 has a thickness of 10 to 20 nm, preferably around 15 nm. A gallium nitride is hard or almost unable to be grown directly on a SiC because of wettability thereof. Accordingly, the GaN channel layer 12 is grown through the AlN nucleus forming layer 11. The GaN channel layer 12 has a thickness of 0.3 to 2.0 µm, preferably around 0.75 µm.

The AlGaN barrier layer 13, which is epitaxially grown on the GaN channel layer 12, operates as an electron supplying layer. A GaN layer and an AlGaN layer cause stresses due to lattice mismatching, which induces charges in an interface therebetween by the piezo effect and generates a two-dimensional electron gas (2DEG). Thus, a channel 12a may be formed in the interface, exactly, in a region next to the interface in the GaN channel layer 12. The AlGaN barrier layer 13 has a thickness of 10 to 40 nm, preferably, around 25 nm; and has an aluminum composition of 20 to 22%, preferably 21%.

The GaN cap layer 14, which is epitaxially grown on the AlGaN barrier layer 13, may prevent oxidization of aluminum (Al) in the AlGaN barrier layer 13. The GaN cap layer 14 has a thickness of 2 to 20 nm, preferably, around 5 nm.

The source electrode 22 and the drain electrode 23, which are provided on the AlGaN barrier layer 13, may be formed by alloying stacked metals of titanium (Ti) and aluminum (Al). The gate electrode 21, which is provided on the GaN cap layer 14 between the source and drain electrodes, 22 and 23, may have stacked metals of nickel (Ni) and gold (Au), where the nickel (Ni) is in contact with the GaN cap layer 14. The HEMT 2A may further provide an insulating film on the GaN cap layer 14. The insulating film may protect the epitaxial substrate 1A. The insulating film may be made of silicon nitride (SiN).

Figure 3:
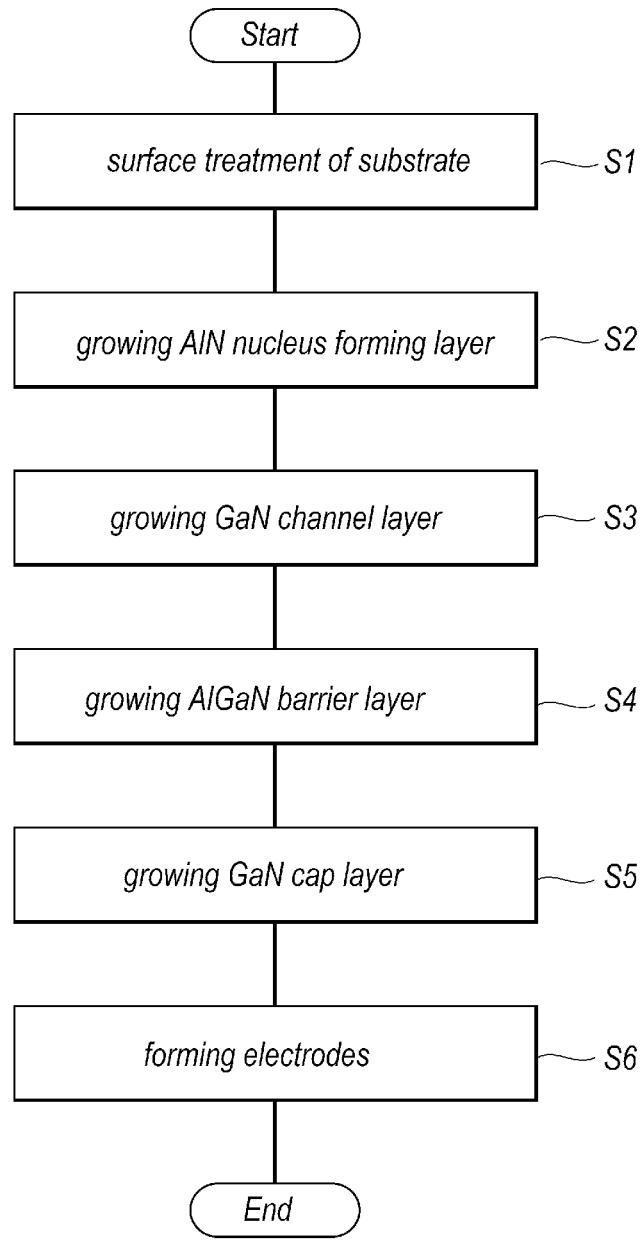
FIG. 3 shows a flow chart of the process of forming the HEMT shown in FIG. 2.
Figure 4:
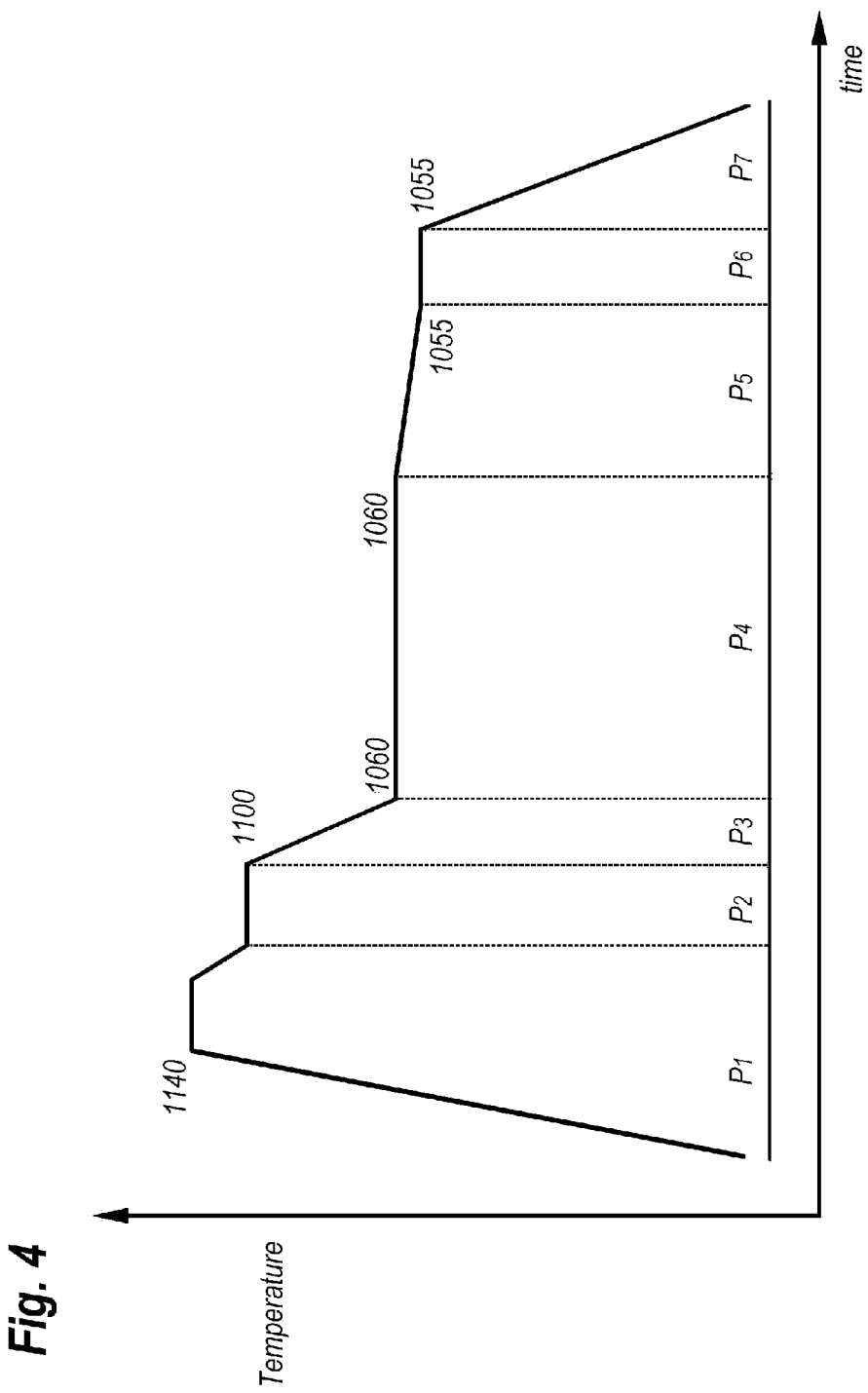
FIG. 4 shows a sequence of a growth temperature according to an embodiment of the present invention.

Next, a process of forming the epitaxial substrate 1A will be described as referring to FIG. 3 that shows a flow chart of the process of forming the epitaxial substrate 1A and the HEMT 2A. FIG. 4 is a diagram of a temperature sequence during the process, where the horizontal axis denotes a time while the vertical axis denotes a temperature of the substrate 10.

The process first performs a surface treatment of the substrate 10 at step $S_1$, which corresponds to a period $P_1$ in FIG. 4. That is, loading the SiC substrate 10 into a growth chamber and setting a pressure in the chamber to a preset one, for instance, 100 Torr (13.3 Pa), the temperature of the substrate 10 is raised to a preset temperature, for instance 1140° C. that is higher than growth temperatures of the respective layers. The SiC substrate 10 is exposed to a hydrogen ($H_2$) atmosphere under this preset temperature for 20 minutes. The temperature of the SiC substrate 10 is substantially equal to a temperature within the growth chamber. After exposing the SiC substrate 10 in a high temperature, the temperature of the SiC substrate 10 is fallen down to the growth temperature of the AlN nucleus forming layer 11.

Next, the AlN nucleus forming layer 11 is grown on the SiC substrate 10 at a temperature of 1090 to 1100° C., which is 1100° C. in the present embodiment. The growth temperature of the AlN nucleus forming layer 11 is kept in constant from a beginning to a finish of the growth of the AlN nucleus forming layer 11. Source materials for the AlN nucleus forming layer 11 are, for instance, tri-methyl-aluminum (TMA) for aluminum (Al) and ammonia ($NH_3$) for nitrogen (N) with flow rates of 130 sccm and 15 slm, respectively. A growth pressure is 100 Torr. Epitaxial growth of the layers from the nucleus forming layer 11 to the cap layer 14 may be carried out by metal organic chemical vapor deposition (MOCVD) technique.

Next, the process lowers the temperature of the SiC substrate 10 down to a growth temperature of the GaN channel layer 12 during period $P_3$ shown in FIG. 4; then grows the GaN channel layer 12 on the AlN nucleus forming layer 11 at step S3 during a period $P_4$ in FIG. 4. The growth temperature of the GaN channel layer 12 is preferably higher than 1055° C. but lower than 1065° C., where the present embodiment sets the growth temperature to be 1060° C. The period $P_4$ maintains the temperature of the SiC substrate 10 constant. Source materials are tri-methyl-gallium (TMG) for gallium (Ga) and ammonia ($NH_3$) for nitrogen (N) with flow rates of 54 sccm and 20 slm, respectively. The growth pressure is 100 Torr.

Next, the AlGaN barrier layer 13 is grown on the GaN channel layer 12 at step $S_4$ during a period $P_5$. The period $P_5$ sets an initial temperature $T_1$ at the beginning thereof but a finish temperature $T_2$ at the completion. The initial temperature $T_1$ may be same with the growth temperature of the GaN channel layer 12, which is 1055 to 1065° C., 1060° C. in the present embodiment, while, the finish temperature $T_2$ may be same with a growth temperature of the GaN cap layer 14, which is 1050 to 1060° C., preferably 1055° C. A difference between the initial temperature $T_1$ and the finish temperature $T_2$ is preferably greater than 5° C. but smaller than 15° C., where the present embodiment shown in FIG. 4 sets the difference to be 5° C. The growth temperature of the AlGaN barrier layer 13 preferably lowers monotonically from the initial temperature $T_1$ to the finish temperature $T_2$ during the period $P_5$, where the present embodiment decreases the growth temperature with a constant rate from the beginning to the completion of the period $P_5$.

Source materials of the AlGaN barrier layer 13 are TMA, TMG, and $NH_3$, and flow rates thereof are adjusted such that the aluminum composition becomes 20 to 22%, where the present embodiment sets the flow rates of those source materials are 140 sccm, 50 sccm, and 20 slm, respectively, and the growth pressure is 100 Torr.

Next, the process finally grows the GaN cap layer 14 on the AlGaN barrier layer 13 as maintaining the growth temperature at the finish temperature $T_2$ at step $S_5$ during a period of $P_6$ shown in FIG. 4. Thus, the growth temperature of the GaN cap layer 14 is the finish temperature $T_2$, which is 1055° C. in the present embodiment and maintained from the beginning to the completion during the period $P_6$. The source materials for gallium (Ga) and nitrogen (N) are TMG and $NH_3$ with flow rates of 60 sccm and 20 slm, respectively, and the growth pressure is 100 Torr. Thus, the epitaxial substrate 1A of the present invention is formed. After the formation of the epitaxial substrate 1A, the temperature in the growth chamber is fallen to a room temperature at period $P_7$.

The HEMT 2A may be formed after the completion of the epitaxial substrate 1A. That is, partly removing the GaN cap layer 14, the electrodes of the source and the drain, 22 and 23, are formed on the AlGaN barrier layer 13 exposed by the partial removal of the GaN cap layer 14; thereafter, the gate electrode 21 is formed on the GaN cap layer 14 left by the partial removal, at step $S_6$. Those formations of the electrodes, 21 to 23, are carried out by sequential processes of a metal evaporation and a lift-off technique subsequent to the metal evaporation.

Also, when the insulating film made of, for instance, silicon nitride (SiN) is provided on the cap layer 14 before the formation of the electrodes, 21 to 23, the process may form the insulating film at a temperature higher than 800° C. The process of the present invention may form the insulating film in the growth chamber continuous to the completion of the epitaxial growth of the layers, 11 to 14, without carrying out the epitaxial substrate 1A from the growth chamber to the air, which may prevent the epitaxial substrate 1A from being oxidized and contaminated with impurities and particles, and may enhance performance and reliability of the HEMT 2A.

Next, advantages of the present invention will be described comparing with conventional techniques. A HEMT has been continuously requested to increase a maximum drain current thereof. When a HEMT has a barrier layer 13 made of AlGaN, an AlGaN layer with increased aluminum composition may enhance the maximum drain current because such an AlGaN barrier layer with increased aluminum composition inevitably expands a difference in lattice constants between an AlGaN crystal and a GaN crystal, which increases charges originated to the piezo effect.

Figure 7:
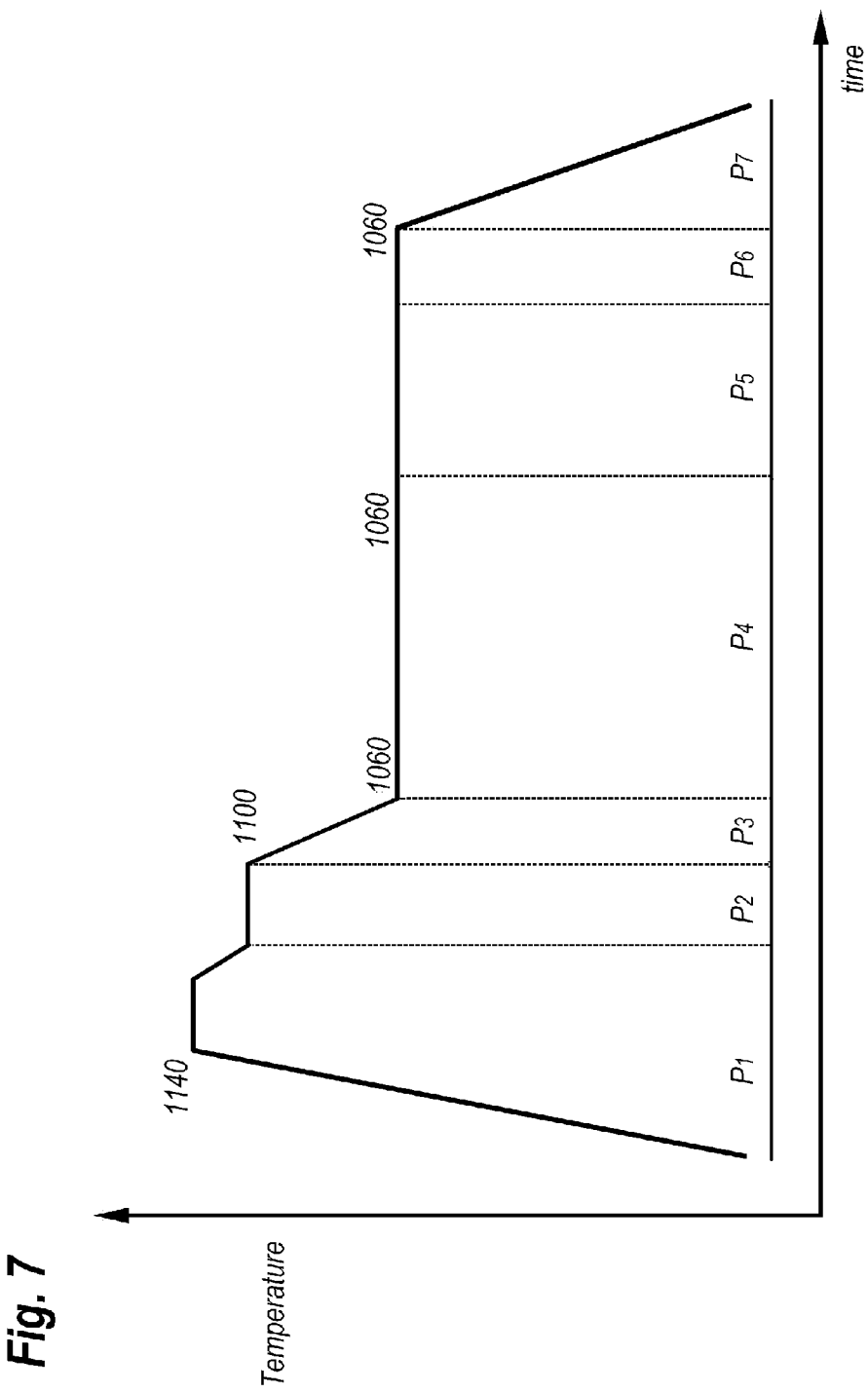
FIG. 7 shows a sequence of a growth temperature for a conventional process.

FIG. 7 shows a conventional sequence of a temperature for growing nitride semiconductor layers. A conventional sequence maintains a growth temperature during the growth of the AlGaN barrier layer 13. An example shown in FIG. 7 sets the growth temperature during the growth of the AlGaN barrier layer to be 1060° C. in the period $P_5$, which is equal to that for growing the GaN channel layer 12.

Figure 8A:
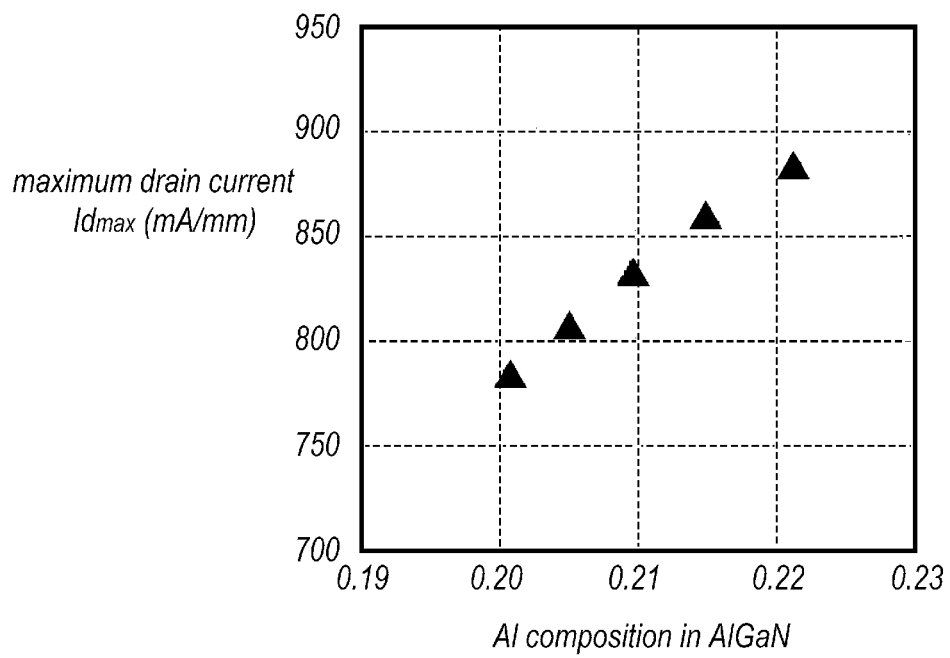
FIG. 8A and FIG. 8B respectively show a maximum drain current and a drain leak current against an aluminum composition in the AlGaN barrier layer for a conventional HEMT where the barrier layer is grown under a constant temperature.

FIG. 8A shows a relation between the maximum drain current $Id_{max}$ and the aluminum composition [Al] in the AlGaN barrier layer 13 that is grown under a condition of a constant growth temperature. In FIG. 8A, the vertical axis denotes the maximum drain current Id for an HEMT with a gate width of 1 mm, while, the horizontal axis corresponds to the aluminum composition [Al] in the AlGaN barrier layer 13. As shown in FIG. 8A, the maximum drain current Id increases as the aluminum composition [Al] becomes greater.

Figure 8B:
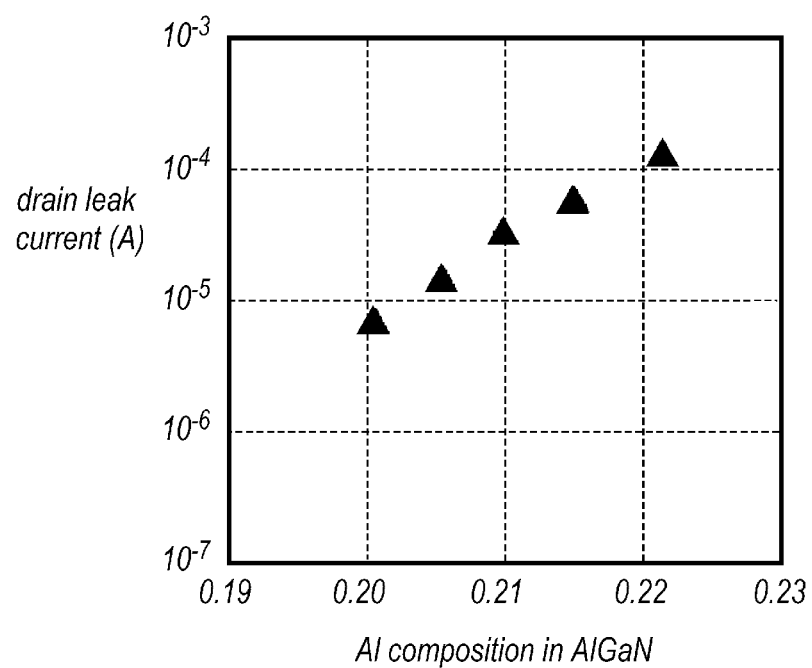

However, the number of charges caused by the piezo effect between the AlGaN barrier layer 13 and the GaN cap layer 14 also increases as the aluminum composition [Al] in the AlGaN barrier layer 13 increases. That is, the lattice mismatching between the AlGaN barrier layer 13 and the GaN cap layer 14 increases as the aluminum composition [Al] becomes greater. FIG. 8B shows a behavior of the drain leak current flowing between the drain 23 and the source 22 when the HEMT 1A tunes off. As shown in FIG. 8B, the drain leak current increases as the aluminum composition [Al] in the AlGaN barrier layer becomes greater.

A HEMT with a thinned GaN channel layer, for instance, less than 1.0 µm, shows a reduced drain leak current; but which is limited under a condition of smaller aluminum composition [Al] in the AlGaN barrier layer 13. Also, such a condition limits a maximum drain current $Id_{max}$. Another solution to reduce the drain leak current is to set the growth temperature for the AlGaN barrier layer 13 lower than the growth temperature for the GaN channel layer 12. A lowered growth temperature may enhance the capture of carbons [C] during the growth, where carbons behave as an acceptor in the GaN channel layer 12, which may also reduce the drain leak current, but degrades crystal quality of the GaN channel layer 12 and also degrades performance of the HEMT.

The present invention, talking subjects above described into account, monotonically lowers the growth temperature for the AlGaN barrier layer 13 from the beginning of the growth, namely the initial temperature $T_1$, to the completion thereof, the finish temperature $T_2$ ($<T_1$) to make the reduction of the drain leak current concurrent with the suppression of the degradation of the maximum drain current.

Figure 5A:
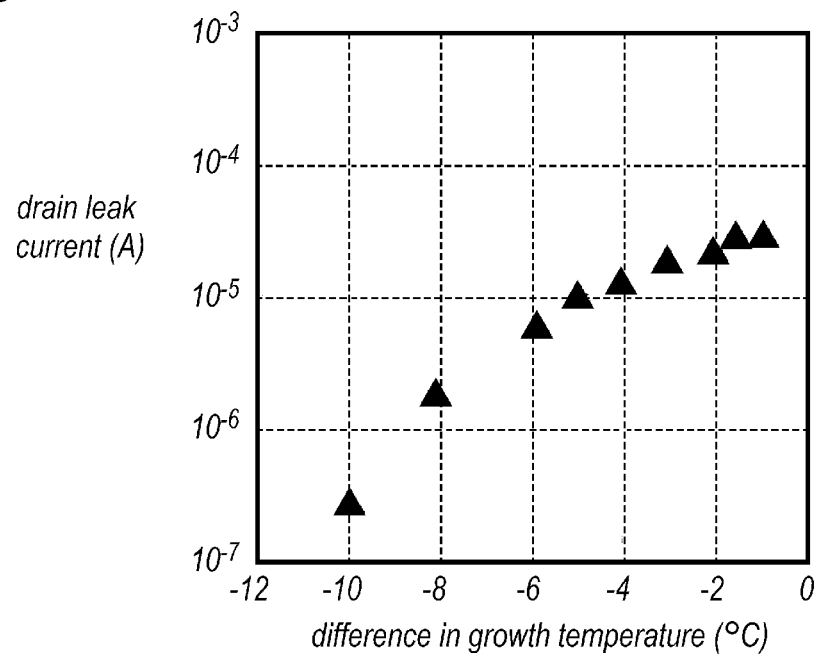
FIG. 5A shows a behavior of the drain leak current against a difference in a the growth temperature for an AlGaN barrier layer.

FIG. 5A shows a relation between the difference in the growth temperature for the AlGaN barrier layer 13 between the finish one $T_2$ and the initial one $T_1$ against the drain leak current of the HEMT 2A that provides the AlGaN barrier layer 13 with the aluminum composition of 21%. As shown in FIG. 5A, as the temperature difference ($T_2-T_1$) in the horizontal axis enhances increases, the drain leak current shown in the vertical axis monotonically decreases.

Figure 5B:
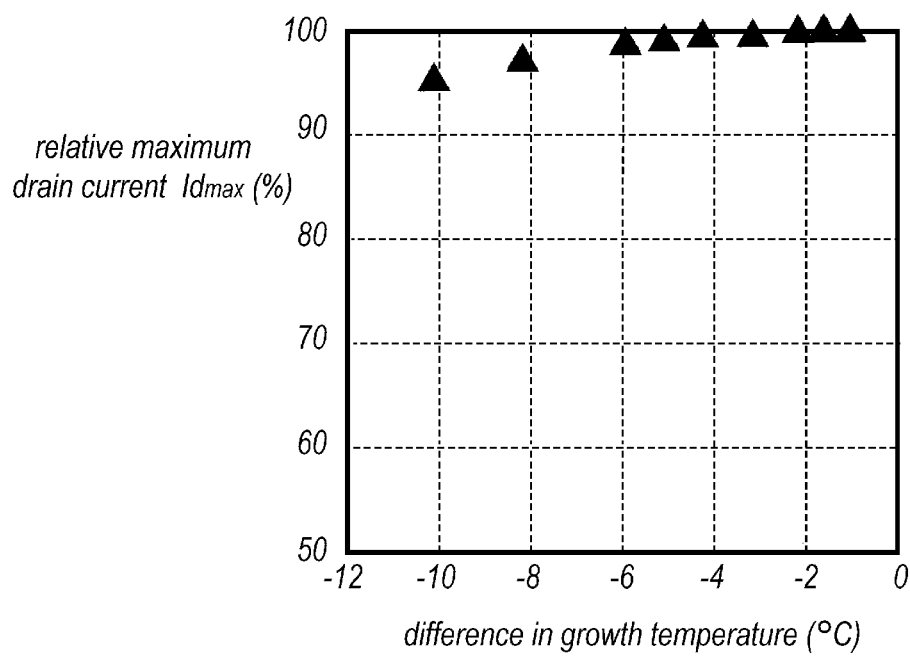
FIG. 5B shows a behavior of the maximum drain current $Id_{max}$ against the difference in the growth temperature, where the maximum drain current $Id_{max}$ is relative to that with no temperature difference.

FIG. 5B shows a relation between the difference in the growth temperature for the AlGaN barrier layer 13 and the maximum drain current Id of the HEMT 2A, where the maximum drain current Id is relative to a case where no difference in the growth temperature for the AlGaN barrier layer is set, that is, a HEMT is formed in a conventional epitaxial process. As shown in FIG. 5B, the maximum drain current $Id_{max}$ relative to a conventional one, or the reduction thereof, may be suppressed even the difference in the growth temperature for the AlGaN barrier layer 13 enhances. The reduction of the maximum drain current $Id_{max}$ may be less than 2% against that of a conventional HEMT when a temperature difference is less than 8° C.

Lowering the temperature gradually during the growth of the AlGaN barrier layer 13, which enhances a growth rate for GaN material relative to that for AlN material, the aluminum composition in the AlGaN barrier layer 13 seems to gradually decrease from an interface against the GaN channel layer 12 to that against the GaN cap layer 14. This may release stresses caused by the lattice mismatching between the AlGaN barrier layer 13 and the GaN cap layer 14, which may resultantly release lattice distortions caused in the GaN channel layer 13 and reduce the drain leak current.

The difference in the growth temperature for the AlGaN barrier layer 13 may be less than 10° C., or even less than 8° C. to reduce the drain leak current as shown in FIG. 5A. The difference of 10° C. in the growth temperature for the AlGaN barrier layer 13 may suppress the reduction of the maximum drain current within 5% at most.

The growth temperature for the AlGaN barrier layer may be linearly lowered with a constant rate. Also, the aluminum composition in the AlGaN barrier layer 13 is preferably 20 to 22% to make the crystal quality of the grown layer concurrent with an enough maximum drain current $Id_{max}$. That is, the aluminum composition less than 22% may result in the quality of the grown layer; while, the composition greater than 20% may suppress the reduction of the maximum drain current $Id_{max}$.

Modification

Figure 6:
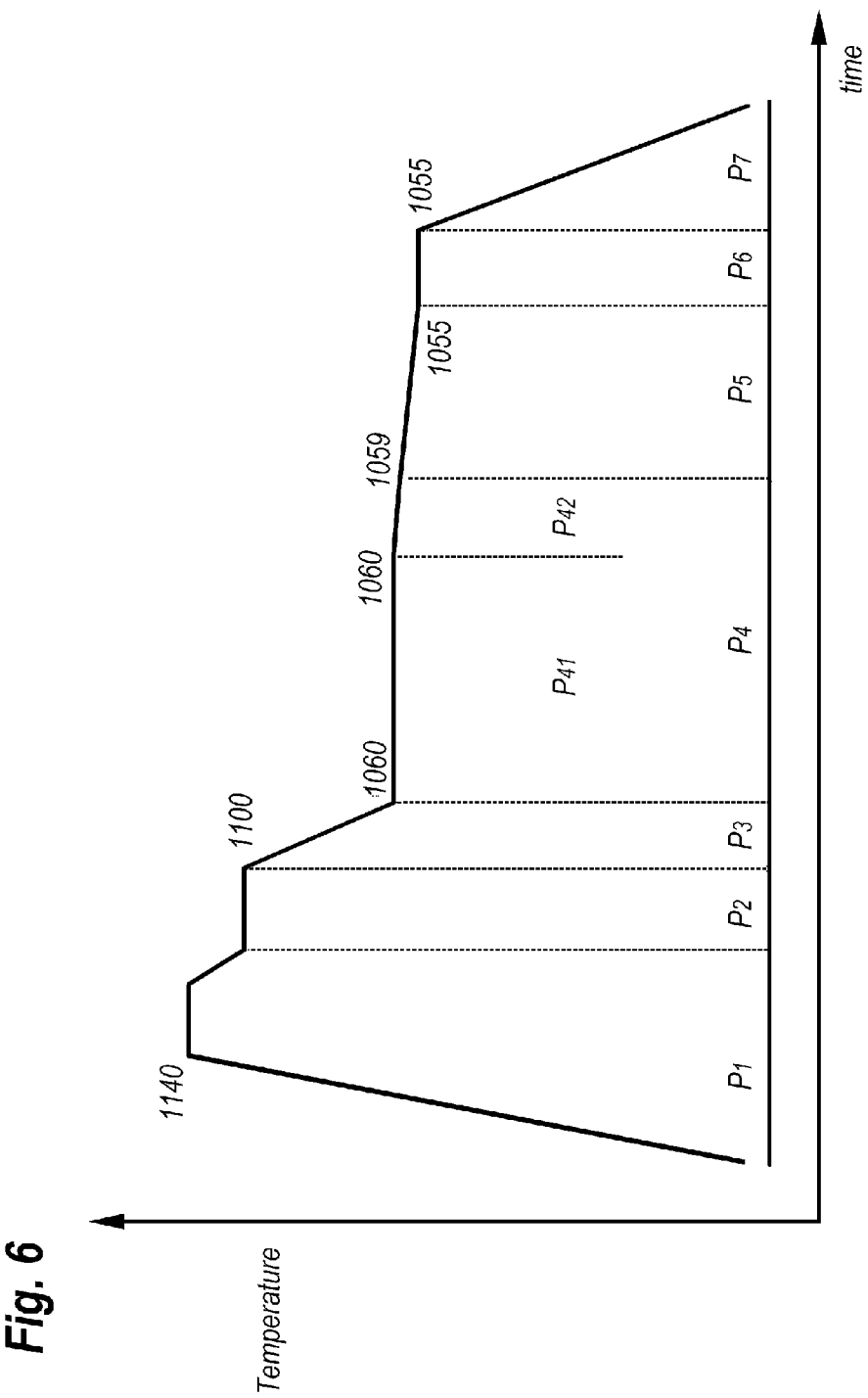
FIG. 6 shows another sequence of a growth temperature modified from that shown in FIG. 4.

FIG. 6 shows a diagram of a temperature sequence according to a modification of the present invention. The sequence shown in FIG. 6 has a feature distinguishable from the former sequence that the growth of the GaN channel layer 12 is done by two periods, $P_{41}$ and $P_{42}$. The period $P_{41}$ sets the growth temperature constant in 1060° C. higher than the initial temperature $T_1$ at the beginning of the growth of the AlGaN barrier layer 13, while, the period $P_{42}$ gradually and monotonically decreases the growth temperature to the initial temperature $T_1$. The period $P_{42}$ grows a portion of the GaN channel layer 12, which is for instance 5 to 25% for the whole GaN channel layer 12. The lowering rate of the grown temperature in the period $P_{42}$ may be substantially same with that in the period $P_5$ for growing the AlGaN barrier layer 13; that is, the lowering of the growth temperature may begin during the growth of the GaN channel layer 12.

The modified sequence shown in FIG. 6 monotonically lowers the temperature to the end temperature $T_2$ from the initial temperature $T_1$ during the growth of the AlGaN barrier layer 13, which may reduce the drain leak current but suppress the reduction of the maximum drain current $Id_{max}$. Also, the lowering of the growth temperature may begin during the growth of the GaN channel layer 12 beneath the AlGaN barrier layer 13, which may gradually increase the capture of carbon atoms, which behave as acceptors, within the GaN channel layer 12; accordingly the drain leak current may be further reduced.

While particular embodiments of the present invention have been described herein for purposes of illustration, many modifications and changes will become apparent to those skilled in the art. For instance, although the embodiments thus described concentrate on a device with the configuration of HEMT, the invention may be applicable to other types of devices having a GaN channel layer, an AlGaN barrier layer, and a GaN Cap layer. Also, the embodiments provide a substrate made of silicon carbide (SiC), the invention may be applicable other types of substrate, for instance, silicon (Si), GaN, sapphire ($Al_2O_3$), and so on. The initial temperature $T_1$, at which the growth of the AlGaN barrier layer begins, is assumed to be 1060° C., or 1059° C. in the modification, but the invention may set other temperatures as the initial temperature $T_1$ at least a condition of $T_1 > T_2$ is satisfied.

The embodiments also concentrate on the condition of linearly lowering the growth temperature for the AlGaN barrier layer; but the condition for lowering the growth temperature is not restricted to a linear condition. The lowering rate of the growth temperature may be varied during the growth at least a condition of the monotonically lowering is satisfied. The HEMTs of the embodiments provide the AlGaN barrier layer 13 directly on the GaN channel layer 12; but another epitaxial layer may be provided between the GaN channel layer 12 and the AlGaN barrier layer 13, which is often called as a spacer layer typically made of aluminum nitride (AlN) to electrically isolates the GaN channel layer 12, exactly, the 2DEG in the GaN channel layer 12 from donors doped in the AlGaN barrier layer 13. In such a configuration, the initial temperature $T_1$ of the present invention may be regarded as a growth temperature of the spacer layer. Accordingly, the appended claims are intended to encompass all such modifications and changes as fall within the true spirit and scope of this invention.

What is claimed is:

1. A process of forming a semiconductor epitaxial substrate, comprising steps of:
   growing a channel layer made of gallium nitride (GaN) on a substrate under a first temperature;
   growing a barrier layer made of aluminum gallium nitride (AlGaN) on the channel layer; and
   growing a cap layer made of GaN on the barrier layer,
   wherein the step of growing the barrier layer monotonically decreases a growth temperature thereof from an initial temperature at a beginning of the step to a finish temperature at completion of the step, the finish temperature being lower than the initial temperature.

2. The process according to claim 1, wherein
   the step of growing the channel layer maintains the first temperature at the initial temperature for the growth of the barrier layer.

3. The process according to claim 1, wherein
   the step of growing the channel layer includes a first period and a second period after the first period,
   in the first period the first temperature is maintained higher than the initial temperature, and
   in the second period the temperature is decreased monotonically from the first temperature to the initial temperature.

4. The process according to claim 3,
   wherein in the second period a rate at which to lower the temperature is set to be substantially equal to a rate at which to lower the temperature in the step of growing the barrier layer.

5. The process according to claim 3,
   wherein the second period grows 5 to 25% of the channel layer.

6. The process according to claim 1,
   wherein the finish temperature is lower than the initial temperature by 10° C. at most.

7. The process according to claim 6,
   wherein the finish temperature is lower than the initial temperature by 5° C. at most.

8. The process according to claim 1,
   wherein the step of growing the barrier layer keeps a rate of lowering the temperature constant.

9. The process according to claim 1,
   wherein the step of growing the barrier layer sets an aluminum composition thereof between 20 to 22%.

10. The process according to claim 1,
    wherein, in the step of growing the cap layer, a growth temperature of the cap layer is the finish temperature.

11. A process of forming a semiconductor epitaxial substrate, comprising steps of:
    growing a channel layer made of gallium nitride (GaN) on a substrate under a first temperature;
    growing a barrier layer made of aluminum gallium nitride (AlGaN) on the channel layer; and
    growing a cap layer made of GaN on the barrier layer, wherein
    in the step of growing the barrier layer, a growth temperature of the barrier layer is decreased monotonically from an initial temperature at a beginning of the step to a finish temperature at completion of the step,
    the finish temperature is lower than the initial temperature,
    the step of growing the channel layer includes a first period and a second period after the first period,
    in the first period, the first temperature that is higher than the initial temperature is maintained, and
    in the second period, the temperature is decreased monotonically from the first temperature to the initial temperature.

12. The process according to claim 11,
    wherein the step of growing the channel layer maintains the first temperature at the initial temperature for the growth of the barrier layer.

13. The process according to claim 11,
    wherein, the second period, a rate at which to lower the temperature is set to be substantially equal to a rate at which to lower the temperature in the step of growing the barrier layer.

14. The process according to claim 11,
    wherein the second period grows 5 to 25% of the channel layer.

15. The process according to claim 11,
    wherein the finish temperature is lower than the initial temperature by 10° C. at most.

16. The process according to claim 11,
    wherein the finish temperature is lower than the initial temperature by 5° C. at most.

17. The process according to claim 11,
    wherein the step of growing the barrier layer keeps a rate of lowering the temperature constant.

18. The process according to claim 11,
    wherein the step of growing the barrier layer sets an aluminum composition thereof between 20 to 22%.

* * * * *